United States Patent [19]

Hammarlund

[11] 4,150,412

[45] Apr. 17, 1979

[54] FILTER EXCITATION CIRCUITRY

[75] Inventor: Gudmar Hammarlund, Vasteras, Sweden

[73] Assignee: ASEA Aktiebolag, Vasteras, Sweden

[21] Appl. No.: 809,470

[22] Filed: Jun. 23, 1977

[30] Foreign Application Priority Data

Jun. 30, 1976 [SE] Sweden ............................ 7607485

[51] Int. Cl.² ............................................ H02H 3/02
[52] U.S. Cl. ...................................... 361/76; 324/108
[58] Field of Search ................. 307/127; 324/86, 108; 340/253 H, 253 Y, 658, 660; 361/76, 77; 323/75 F

[56] References Cited

U.S. PATENT DOCUMENTS

| | | | |
|---|---|---|---|
| 3,992,651 | 11/1976 | Hodges | 361/76 |
| 4,000,446 | 12/1976 | Vandevier et al. | 361/76 X |

FOREIGN PATENT DOCUMENTS 448531  9/1974  U.S.S.R. ................................... 307/127

Primary Examiner—A. D. Pellinen
Attorney, Agent, or Firm—Watson, Cole, Grindle & Watson

[57] ABSTRACT

The circuitry for generating filter excitation signals from a multi-phase alternating current input is provided with the following circuitry for each phase of the multi-phase alternating current input. A current transformer connected to a respective phase of the multiphase alternating current input is connected to a bridge rectifier having one node connected to a neutral conductor and including a resistor of equal resistance value connected in each parallel branch of the bridge rectifier between the neutral conductor and the input of the current transformer. An operational amplifier having inputs respectively responsive to the voltage across each of the respective resistors in the bridge rectifier generates an output for one phase of the excitation signal to the filter. The filter excitation circuitry has application to two-phase and three-phase systems wherein the excitation circuitry is identical for each phase.

6 Claims, 1 Drawing Figure

FILTER EXCITATION CIRCUITRY

BACKGROUND OF THE INVENTION

1. Field of the Invention

The present invention relates to circuitry for the excitation of filters in electrical protection devices such as line protectors, generator protectors, motor protectors, and the like.

2. Prior Art

In excitation circuits where the peak or mean value of two or three-phase currents are measured by circuits comprising current transformers, rectifiers and smoothing devices, there are normally required additional transformers for the excitation of filters, such as for example positive or negative sequence filters. The excitation voltage of such filters is required to have exactly the same shaped characteristic as that of the primary side of the current transformers and such excitation voltage must not be influenced by the loads in the current measurement circuits. Also the filter excitation must not affect the measurement of the phase currents.

According to a known method of filter excitation, which avoids additional current transformers, an excitation voltage is obtained which is a direct image of the primary current of the current transformer by sensing the current through a rectifier bridge using a low-ohmic resistor and a differential amplifier. However, that excitation voltage is related to the signal zero and the positive polarity of the rectifier signal alternatively every second half cycle, which complicates the method of current measurement, as the sinusoidal input signal is superimposed on a square wave, the amplitude of which varies with the current.

SUMMARY OF THE INVENTION

The above-mentioned disadvantages of known filter excitation circuitry are entirely avoided with the excitation circuitry according to the present invention.

The inputs to an operational amplifier are each respectively connected to one of two resistors, each having equal resistance values in corresponding arms of a rectifier bridge and both resistors are connected to the neutral conductor (to provide a zero level signal reference), such that the operational amplifier has one half-cycle on one input and the other half-cycle on its outer input. One input of the operational amplifier is inverted and the amplifier combines the two half-cycle signals into an alternating voltage, which has exactly the same shaped characteristic as the current on the primary side of the current transformer. The alternating voltage is referenced to the neutral conductor. The aforementioned properties of the amplifier signal output make it possible to use it for the excitation of filters.

BRIEF DESCRIPTION OF THE FIGURE

The accompanying drawing shows a diagram of an exemplary circuit for the excitation of a filter.

DETAILED DESCRIPTION

Figure 1:
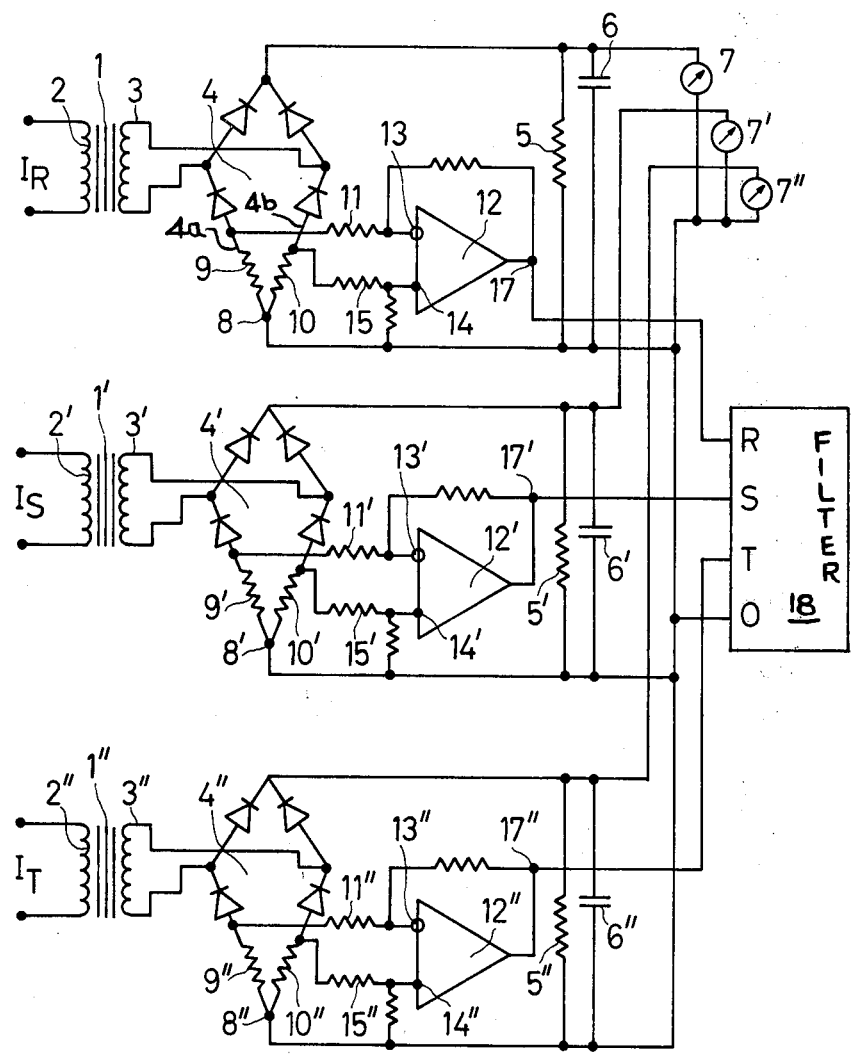

The FIGURE shows a three-phase device with current transformers arranged in phases IR and IT. Since the structure and operation of the components for each phase are identical, a description of the components and the operation thereof for one phase only is necessary for an understanding of the invention. Current transformer 1 has primary winding 2, through which flows line current IR. Secondary winding 3 is connected to rectifier bridge 4 and resistor 5 is connected in parallel across the rectifier bridge, to provide a voltage proportional to the phase current across resistor 5. A smoothing device in the form of capacitor 6 is connected in parallel with resistor 5. Current measuring device 7 is connected between the positive terminal of the bridge and the neutral conductor 16.

Resistors 9 and 10 are respectively connected to each of two bridge branches 4a, and 4b which are located between neutral point 8 and the connections to secondary winding 3. Resistors 9, 10 have the same resistance and are connected together at neutral point 8. The other end of resistor 9 is connected through resistor 11 to inverted input 13 of operational amplifier 12. The other resistor 10 is connected to second input 14 of operational amplifier 12 through resistor 15. Input 14 is also connected to neutral conductor 16. Output 17 of operational amplifier 12 is connected to the R-phase input of filter 18, which may be a positive or negative sequence filter. The T-phase input of filter 18 receives the output from operational amplifier 12" in the other filter excitation circuit, the components of which are indicated by double primed numerals in the FIGURE. The S-phase input of filter 18 receives the output from operational amplifier 12' in the remaining filter excitation circuit. The S and T-phase circuits operate in the same way as the above-described R-phase circuit.

While the FIGURE shows a three-phase circuit for exciting a filter, the excitation being performed from phases R, S and T. This is sufficient for Y-connected networks. In the case of D-connected networks, two-phase excitation is used.

During one half-cycle of the alternating current the current flows through resistor 10 and input 14 of operational amplifier 12 is supplied with a positive voltage pulse corresponding to the current through resistor 10. A positive voltage pulse occurs on output 17 of operational amplifier 12 and thus on the corresponding phase input R of filter 18. During the second half-cycle of the alternating current, the current in rectifier bridge 4 flows through resistor 9, but since input 13 of amplifier 12 is inverted, output signal 17 has the opposite polarity in relation to the output signal pulse that occurred during the preceding half-cycle. Each input R, S and T of filter 18 is provided with alternately positive and negative half-cycle pulses which, when taken together, constitute a direct image of the current of the primaries 2, 2', 2" of current transformers 1, 1', 1" respectively. Both input signals 13, 14, 13', 14' and 13", 14" to operational amplifiers 12, 12' 12", respectively are directly related to the reference potential of the neutral conductor, and therefore the signals 17, 17', 17" at the respective inputs R, S and T of filter 18 have a fixed reference.

Since resistors 9 and 10 have the same resistance value and are each positioned in respective parallel branches 4a, 4b of rectifier bridge 4, they create no unbalance in the bridge and therefore the current measurement of measuring devices 7, 7', 7" is not disturbed either, as the resistance value is low-ohmic.

What is claimed is:

1. Circuitry for generating filter excitation signals from each phase of a multi-phase alternating current input, comprising:
    a current transformer having a primary winding connected to one phase of said multi-phase alternating current input;
    bridge rectifier means for rectifying the current from a secondary of said current transformer, and having one node connected to a neutral conductor, and including a resistor of equal resistance value connected in each parallel branch of said bridge rectifier between said neutral conductor and the input of said current transformer;

an operational amplifier having respective inputs responsive to the voltage across a respective resistor in said bridge rectifier means for generating one phase output forming at least a part of said filter excitation signals.

2. Circuitry as in claim 1 wherein one of said operational amplifier inputs is inverted.

3. Circuitry as in claim 2 wherein said alternating current input is a two phase input and there are two excitation circuits each comprising said current transformer, bridge rectifier means and operational amplifier wherein each of the operational amplifiers in each excitation circuit generates a respective phase output of the two phase output signals forming said filter excitation signals.

4. Circuitry as in claim 3 further comprising a filter including two phase inputs each responsive to the respective phase outputs of said two operational amplifiers.

5. Circuitry as in claim 2 wherein said alternating current input is a three phase input and there are three excitation circuits each comprising said current transformer, bridge rectifier means and operational amplifier wherein each of the operational amplifiers in each excitation circuit generates a respective phase output of the three phase output signals forming said filter excitation signals.

6. Circuitry as in claim 5 further comprising a filter including three phase inputs each responsive to the respective phase outputs of said three operational amplifiers.

* * * * *